(12) United States Patent
Howe et al.

(10) Patent No.: US 11,646,095 B2
(45) Date of Patent: May 9, 2023

(54) CONFIGURABLE SOFT POST-PACKAGE REPAIR (SPPR) SCHEMES

(71) Applicant: Micron Technology, Inc., Boise, ID (US)

(72) Inventors: Gary Howe, Allen, TX (US); John E. Riley, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 217 days.

(21) Appl. No.: 16/811,691

(22) Filed: Mar. 6, 2020

(65) Prior Publication Data

US 2021/0280267 A1    Sep. 9, 2021

(51) Int. Cl.
| | |
|---|---|
| *G11C 29/44* | (2006.01) |
| *G11C 17/18* | (2006.01) |
| *G11C 17/16* | (2006.01) |
| *G11C 29/38* | (2006.01) |
| *G11C 29/54* | (2006.01) |

(52) U.S. Cl.
CPC .......... *G11C 29/4401* (2013.01); *G11C 17/16* (2013.01); *G11C 17/18* (2013.01); *G11C 29/38* (2013.01)

(58) Field of Classification Search
None
See application file for complete search history.

(56) References Cited

U.S. PATENT DOCUMENTS

| | | | | |
|---|---|---|---|---|
| 4,736,373 A | * | 4/1988 | Schmidt | G11C 29/72 714/711 |
| 5,126,973 A | * | 6/1992 | Gallia | G11C 29/808 365/230.06 |
| 5,883,849 A | * | 3/1999 | Shirley | G11C 11/4096 365/201 |
| 6,163,488 A | * | 12/2000 | Tanizaki | G11C 17/16 365/200 |
| 6,813,739 B1 | * | 11/2004 | Grannis, III | G01R 31/2815 714/729 |
| 7,505,295 B1 | * | 3/2009 | Nataraj | G11C 15/00 365/203 |
| 9,711,243 B1 | * | 7/2017 | Nautiyal | G11C 29/846 |
| 9,805,828 B1 | * | 10/2017 | Yoko | G11C 29/78 |
| 10,403,390 B1 | | 9/2019 | Wilson et al. | |
| 2002/0003279 A1 | * | 1/2002 | Lee | G11C 29/70 257/529 |
| 2002/0019961 A1 | * | 2/2002 | Blodgett | G11C 29/846 714/718 |
| 2004/0163015 A1 | * | 8/2004 | Nadeau-Dostie | G11C 29/44 714/42 |
| 2006/0092725 A1 | * | 5/2006 | Min | G11C 29/787 365/200 |

(Continued)

*Primary Examiner* — Cynthia Britt
*Assistant Examiner* — Dipakkumar B Gandhi
(74) *Attorney, Agent, or Firm* — Fletcher Yoder, P.C.

(57) ABSTRACT

Systems and methods to perform multiple row repair mode for soft post-packaging repair of previously repaired data groups are disclosed. The devices may have activation circuitry that includes a mode register bit or a control antifuse that sends an input signal upon activation. The devices may also include a logic element that receives the input signal and sends, upon receiving the input signal, a configuration signal that enables a multiple row repair mode.

20 Claims, 5 Drawing Sheets

(56) References Cited

U.S. PATENT DOCUMENTS

| | | | |
|---|---|---|---|
| 2008/0259701 A1* | 10/2008 | Gajjewar | G11C 29/808 365/200 |
| 2009/0059682 A1* | 3/2009 | Park | G11C 29/027 365/189.07 |
| 2015/0135038 A1* | 5/2015 | Wilson | G11C 29/76 714/773 |
| 2016/0372214 A1* | 12/2016 | Shim | G11C 17/18 |
| 2017/0227605 A1* | 8/2017 | Kim | G01R 31/31723 |
| 2018/0033472 A1* | 2/2018 | Yang | G11C 7/067 |
| 2018/0308562 A1* | 10/2018 | He | G06F 11/181 |
| 2019/0051371 A1* | 2/2019 | Kim | G11C 29/12015 |
| 2020/0185052 A1* | 6/2020 | Nale | G11C 7/1045 |

\* cited by examiner

CONFIGURABLE SOFT POST-PACKAGE REPAIR (SPPR) SCHEMES

BACKGROUND

1. Field of the Present Disclosure

This disclosure relates to memory devices, and more particularly, to methods and systems capable of performing multiple modes of post-package repair of memory devices.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operation and/or facilitate data storage that may facilitate data processing operations. To that end, these memory devices may have multiple memory cells that can each store one or more bits of information. The memory cells may be arranged in addressable groups (e.g., rows or columns) within a memory array of a memory bank. When a memory controller receives a request to access a row or column, such as when performing a read or write operation, the memory controller may activate the access to the row and/or column of memory cells.

Due to manufacturing errors and/or failures, certain memory cells may be defective. Quality control testing may be used to identify rows and/or columns containing such defective memory cells. If the number of defective memory cells is small, a pre-packaging re-assignment of memory cells may be used to prevent discarding of otherwise functional devices. In such systems, additional addressable data cells (e.g., redundant rows and/or columns) may be made available during manufacturing and the address associated with a defective row and/or column may be reassigned to a redundant row and/or column. Such reassignment may be hard-wired. For example, the reassignment information may be stored in a non-volatile storage device (e.g., blowing fuses or antifuses disposed within the memory device). Such operation is not easily reversible due to the non-volatility of the storage device.

In the normal course of usage of the memory device, other memory rows and/or columns may fail and present defective cells. In order to increase the lifetime of the memory devices in the presence of these defects, post-package repair (PPR) methods may be employed to repair the memory device. The DDR5 standard defines two types of PPR remapping capabilities, referred to as "hard-PPR" and "soft-PPR." Hard-PPR permanently remaps accesses from a designated faulty row to a designated spare row. A Hard-PPR row remapping survives power cycles. Soft-PPR remapping temporarily maps accesses from a faulty row to a designated spare row.

In some cases, multiple row addresses in the memory device may be repaired. Typically 2, 4, or 8 row addresses are repaired with LSB addresses compressed. This requires data in all associated rows of a soft post-package repair to be written back to a die utilizing SPPR. In many applications, the time and complexity required to restore data to multiple rows is undesirable or prohibitive. For those applications, SPPR repair of a single row address may be preferred. Other applications may not have this limitation or do not employ SPRR mode and only HPPR mode where preservation of data is not required.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using electronic memory cells, such as capacitors, flip-flops, latches and/or inverter loops, among others. Examples of memory devices include random access memories (RAMs) devices, dynamic RAM (DRAMs) devices, static RAM (SRAMs) devices, and/or flash memories. In such systems, the memory cells may be grouped in memory arrays, which may be addressed in groups (e.g., rows and/or columns). In the present application, the descriptions of the embodiments are related to memory arrays containing memory cells organized in rows (e.g., data rows). It should be understood that the methods and systems described herein may be used in memory devices having memory cells organized in columns.

During certain operations, such as reading and writing operations, a controller in the memory device may receive an address for a memory cell. The memory device controller may determine which memory bank contains the requested memory cell and request access from the corresponding memory bank controller. In turn, the memory bank controller may identify and activate the data row containing the requested memory cell, to perform the requested operation.

In certain memory devices, the memory bank may include additional data rows, which may be redundant rows or post-package rows (PPR rows), as detailed below. Following manufacturing, defective rows (e.g., data rows containing defective cells) may be identified during pre-packaging tests. If a defective row is identified, the defective row may be deactivated and a redundant row may be used in its place. To that end, a non-volatile memory system may store information such as the assigned address of the defective row, and the address of the redundant row to be used in its place. Such pre-package repair is described herein as redundant row repair. Further repair of data rows may take place post-packaging by assigning a defective row to a PPR row. The post-package repair (PPR) may be a hard post-package repair (HPPR), or soft post-package repair (SPPR). HPPR or SPPR may take place by storing the address of a defective row in a memory and rerouting requests from the defective row to a PPR row.

Existing methods for SPPR are often limited to single row address repair. In other words, only one row address may be repaired at a time using SPPR. In other instances, multiple row addresses, such as 2, 4, or 8 row addresses, may need repair. In such instances, HPPR is typically utilized to handle repair of the multiple row addresses. However, it may be beneficial to configure the SPPR latch to repair both single and multiple row addresses before utilizing HPPR mode. Multiple repair row mode in SPPR may match the repair that can later be permanently enabled by HPPR mode. This may enable a user to verify that rows enabled by HPPR are functional before performing HPPR repair. As such, making SPPR configurable to repair a single or multiple rows provides a method to more optimally meet the requirements of any application.

Figure 1:
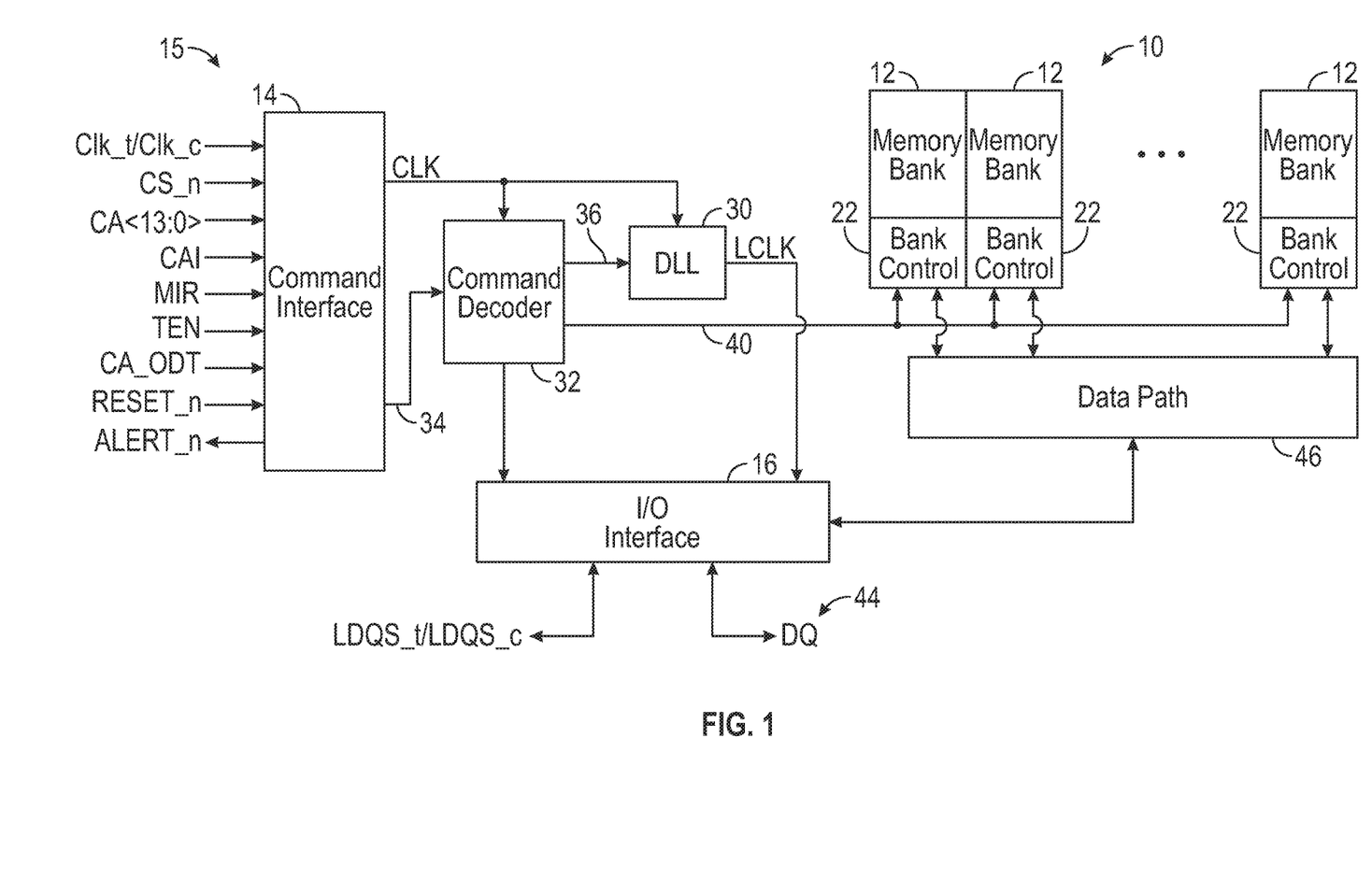
FIG. 1 is a block diagram illustrating an organization of a memory device that may implement post-package repair (PPR) of redundant rows, in accordance with an embodiment.

Turning now to the figures, FIG. 1 is a simplified block diagram illustrating certain features of a memory device 10. Specifically, the block diagram of FIG. 1 is a functional block diagram illustrating a DRAM memory device 10 that may perform PPR in redundant rows. In accordance with one embodiment, the memory device 10 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (GB) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 15) from processing circuitry coupled to the devices, such as a processor or controller. The processor or controller may provide various signals 15 to the memory device 10 to facilitate the transmission and receipt of data to be written to or read from the memory device 10. As an example of signals 15, the processor or controller may request a read and/or write operation by providing the corresponding command and an address via the CA bus.

The command interface 14 may receive one or more clock signals from an external device. Generally, double data rate (DDR) memory utilizes a clock signal referred to herein as a Clk signal 52, which may be provided as a differential pair formed by the true clock signal (Clk_t) and the complementary clock signal (Clk_c). The positive clock edge for Clk signal 52 in DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The command interface 14 receives the true clock signal (Clk_t) and the complementary clock signal (Clk_c) and generates an internal clock signal CLK. The internal clock signal CLK may be supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands.

Further, the command decoder 32 may decode commands, such as read commands, write commands, mode-register set commands, activate commands, etc., and provide access to a particular memory bank 12 corresponding to the command, via the bus 40. As will be appreciated, the memory device 10 may include various other decoders, such as row decoders and column decoders, to facilitate access to the memory banks 12. In one embodiment, each memory bank 12 includes a bank control circuitry 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address (CA) bus may be a 14-bit bus to accommodate the command/address signals (CA<13:0>). The command/address signals are clocked to the command interface 14 using the clock (Clk_t and Clk_c), as discussed above. Access to specific memory banks 12 within the memory device 10 is encoded on the CA<13:0> bus with the commands. As an example, a processor requesting data from memory device 10 may provide a CS enable signal via an input pin to inform the memory device 10 that it should operate on the CA signal available in the bus. To this end, the command interface 14 and/or the command decoder 32 may receive the CA signal to identify the command and the target memory banks 12 associated with the address in the CA signal. The command decoder 32 may, via the bus 40, request the bank control circuitry 22 associated with the target memory bank 12 to activate a data row or data column associated with the requested address in the CA signal. Based on the command received via bus 40, the bank control block may cause the memory banks 12 to provide the requested data via data path 46 and I/O interface 16 or to store in the memory banks data available in the data path 46, received via I/O interface 16.

In addition, the command interface 14 may be configured to receive a number of other command signals. For instance, a command/address on die termination (CA_ODT) signal may be provided to facilitate proper impedance matching within the memory device 10. A reset command (RESET) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT) to the system processor or controller for certain errors that may be detected. For instance, an alert signal (ALERT) may be transmitted from the memory device 10 if a cyclic redundancy check (CRC) error is detected. Other alert signals may also be generated. Further, the bus and pin for transmitting the alert signal (ALERT) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. To allow for higher data rates within the memory device 10, certain memory devices, such as DDR memory devices, may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t/ and DQS_c) to provide differential pair signaling during reads and writes.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
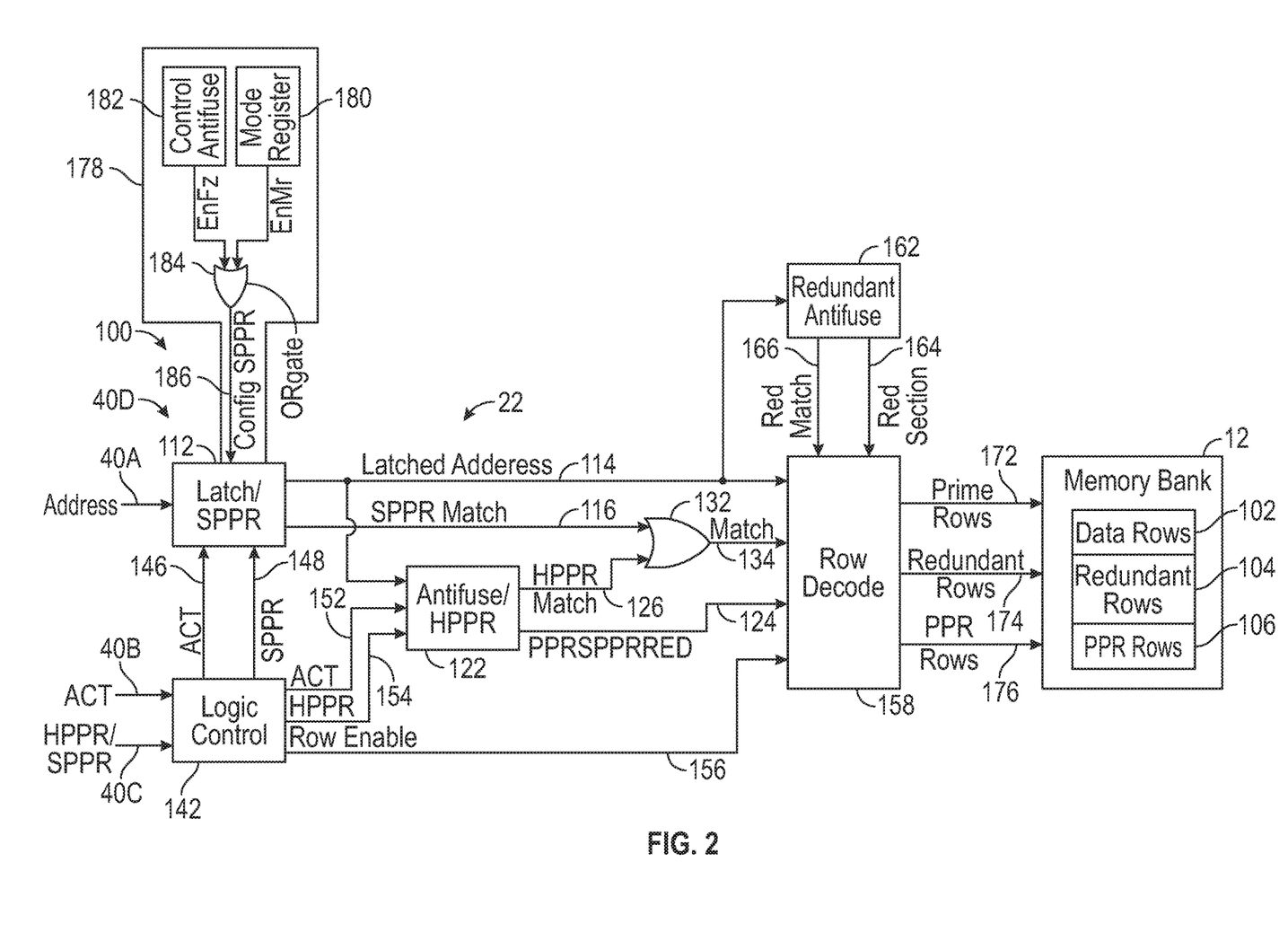
FIG. 2 is a block diagram illustrating memory bank control circuitry that may perform post-package repair (PPR) of redundant rows, in accordance with an embodiment.

FIG. 2 illustrates row selection circuitry 100 that may be disposed in the bank control circuitry 22 that controls a memory bank 12. The memory bank 12 may include an array of memory cells, which may be arranged in rows and/or columns. In the illustrated example, memory cells in memory bank 12 are arranged in data rows 102 (e.g., primary data cells), redundant data rows 104, and PPR data rows 106 (e.g., secondary data cells used for repair). In this memory bank, data rows 102 include the memory cell rows initially assigned for regular operation during production and redundant data rows 104 include additional memory cell rows that may be used during pre-package repair, as discussed above (e.g., repair performed by a non-customer). The PPR data rows 106 may be additional memory cell rows available for usage in soft post-package repair or hard post-package repair (e.g., repair performed by a customer). As detailed below, data rows 102 may be directly addressed by prime row activation lines, redundant data rows 104 may be selected by redundant row selection lines and PPR data rows 106 may be activated by PPR selection lines. In some memory devices, redundant data rows 104 and PPR data rows 106 may be a single group of memory cell rows with a shared address scheme.

Row selection circuitry 100 may receive an address signal 40A, an activation signal 40B, and a SPPR/HPPR signal 40C. Based on the address contained in the address signal 40A, row selection circuitry may activate a corresponding prime data row 102, if that row has not been repaired. If the row has been repaired, either via the redundant row mechanism, performed before packaging, or via the HPPR or the SPPR, performed after packaging (e.g., by the customer), row selection circuitry 100 may prevent activation of the corresponding defective prime data row 102 and may activate the repaired row (e.g., the redundant data row 104 or the PPR data row 106) reassigned to be used in place of the defective prime data row 102. To perform and/or identify an SPPR repair, the SPPR circuitry 112 may be used. During an SPPR repair operation, SPPR circuitry 112 may store the received address in address signal 40A in a local volatile memory, to perform SPPR. During regular operation (i.e., not during a repair), SPPR circuitry 112 receives and latches the address signal 40A to produce a latched address 114, that may be used by other circuitry in the row selection circuitry 100. Moreover, if the SPPR circuitry 112 determines that the address in the address signal 40A matches the stored address, the SPPR circuitry may provide an SPPR match signal 116 to indicate that the received address signal 40A corresponds to a row repaired via SPPR.

In one or more embodiments, the SPPR circuitry 112 may be configured by a activation circuitry 178 that includes a mode register bit 180 or a control antifuse 182 to repair single or multiple received addresses. The mode register bit 180 may alternate between single row testing and multiple row testing (i.e., set to 0 or 1) by a user via a switch or a command entry. The SPPR circuitry 112 may then alternate between identifying single or multiple rows for SPRR repair.

In such an embodiment, the SPPR repair operation may repair a single row while the HPPR repair operation may repair multiple rows. The control antifuse 182 may be blown to configure the SPPR circuitry to repair multiple received addresses.

Both the mode register bit 180 and the control antifuse 182 may connect to a logic element 184 (e.g., OR gate) via input terminals on the logic element. An input signal from either device may enable the mode register bit 180 (e.g., EnMr) or enable the control antifuse 182 (e.g., EnFz). The output of the logic element 184 may be a configuration signal 186 to the SPPR circuitry 112 to indicate whether to enter single row repair mode or multiple row repair mode. The configuration signal 186 may be a logic low signal, logic high signal, or other signal to indicate which repair mode is active. For example, the logic element 184 may output a logic low signal to indicate single row repair mode and a logic high signal to indicate multiple row repair mode.

To perform and/or identify HPPR repair, HPPR circuitry 122 may be used. During an HPPR repair operation, the HPPR circuitry 122 may store the latched address 114 in a local non-volatile memory, which may be write-once internal memory devices (e.g., antifuse banks). In some embodiments, each non-volatile memory cell may be associated with a PPR data row 106. During regular operation (i.e., not during a repair), HPPR circuitry 122 may compare the latched address 114 with the address stored in the antifuse banks and, if a match appears, provide a corresponding PPR row address 124 and a HPPR match signal 126. A logic element 132 (e.g., OR gate) may combine SPPR match signal 116 and HPPR match signal 126 to produce a match signal 134. During regular operation, match signal 134 indicates that the address signal 40A contains an address that was repaired via HPPR and/or SPPR.

Controller logic 142 in the row selection circuitry 100 may be used to manage the operation of SPPR circuitry 112 and HPPR circuitry 122. Controller logic 142 may receive, via SPPR/HPPR signal 40C, instructions to indicate that the customer is requesting a post-package repair (e.g., a HPPR or an SPPR). In some embodiments, the SPPR/HPPR signal 40C may be an instruction that specifies the mode of post-package repair. Controller logic may also receive the ACT signal 40B, that may include an activation trigger (e.g., an activating edge) that synchronizes the operations associated with data row activation and/or data row repair. When controller logic 142 requests an SPPR, controller logic 142 may send an ACT signal 146 and an SPPR signal 148 to the SPPR circuitry 112. When controller logic 142 requests an HPPR, it may send an ACT signal 152 and an HPPR signal 154 to the HPPR circuitry 122.

Controller logic 142 may also provide an activating row enable signal 156 to a row decoder 158 to trigger an activation of memory cell rows. Row decoder 158 may receive the latched address 114, the PPR row address 124, the match signal 134 and the row enable signal 156, described above. Row decoder 158 may be further coupled to redundant repair circuitry 162, that may store address repaired pre-packaging. Redundant repair circuitry 162 may compare a received latched address 114 with internal non-volatile memory cells (e.g., antifuse banks). If a match is identified (i.e., latched address 114 is associated with a redundant data row 104), redundant repair circuitry 162 may provide the redundant row address 164 associated with the latched address 114, and assert the redundant match signal 166. In some embodiments, redundant repair circuitry 162 and HPPR circuitry 122 functionalities may be provided by a single repair circuitry that includes non-volatile memory storing repaired addresses matched to redundant data rows 104 and/or PPR data rows 106.

Row decoder 158, detailed below, may receive the latched address 114, repair match information (e.g., match signal 134 and redundant match signal 166), repair address (e.g., PPR row address 124 and redundant row address 164), and a triggering row enable signal 156, and activate specific data rows. If the latched address corresponds to a prime data row 102 that has not been repaired, row decoder 158 may activate the prime row (i.e., the prime data row 102 assigned during manufacturing) via prime row signal 172. If the latched address corresponds to a pre-package repaired row, row decoder 158 may activate the associated redundant row using the redundant row address bus 174. If the latched address corresponds to a post-package repaired row, row decoder 158 may activate the associated PPR row using the PPR row address bus 176. Row selection circuitry 100 implements an overriding or trumping mechanism for operation, in which HPPR and SPPR repaired rows take precedence over redundant rows. Such a mechanism obviates the requirement for overriding redundant row repairs in the process of performing HPPRs and/or SPPRs, as the non-volatile memory in redundant repair circuitry 162 does not need to be modified.

Figure 3:
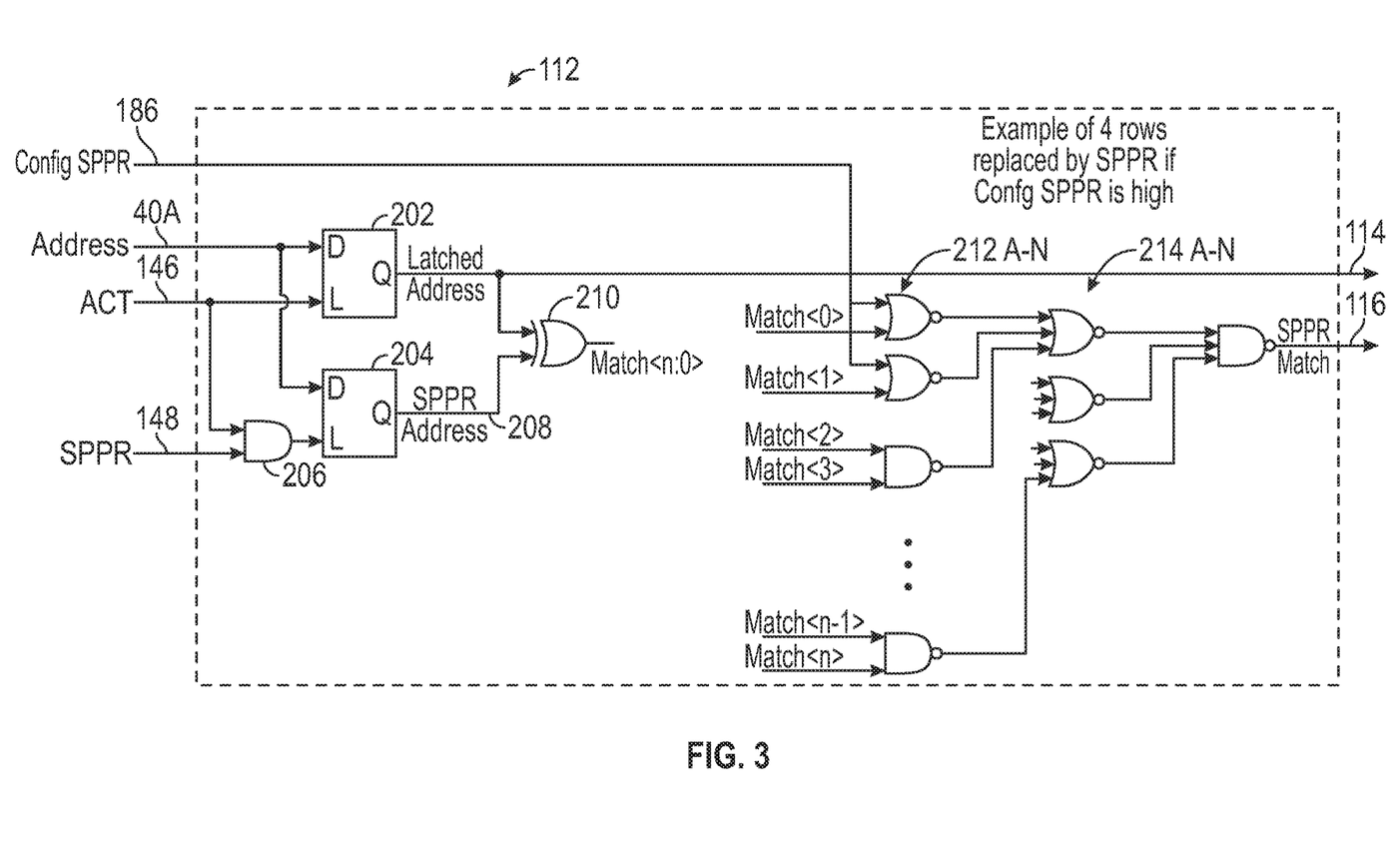
FIG. 3 is a block diagram illustrating a soft PPR (SPPR) latch circuitry that may be used by memory bank control circuitry such that of FIG. 2, in accordance with an embodiment.
Figure 4:
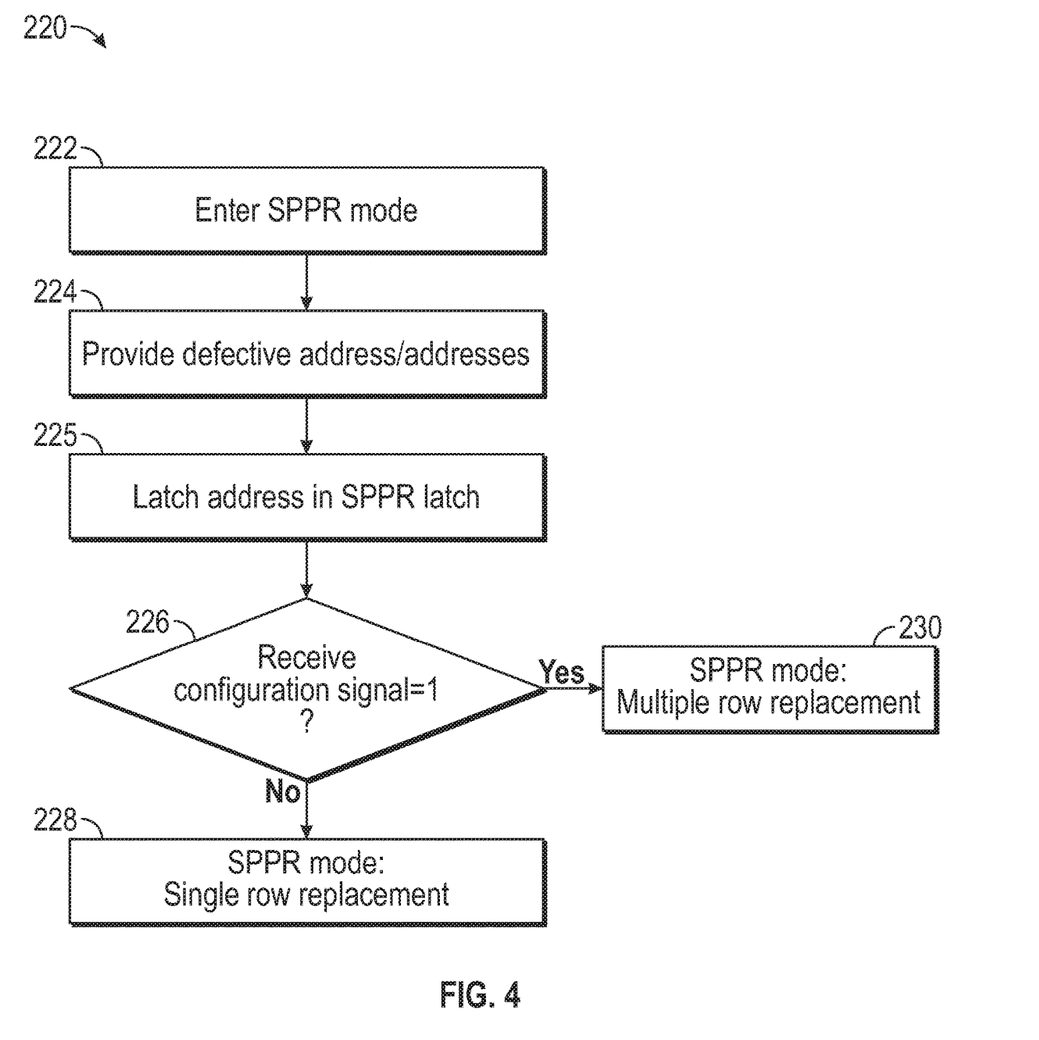
FIG. 4 is a method to perform SPPR for multiple address rows, in accordance with an embodiment.

FIG. 3 illustrates SPPR circuitry 112, and FIG. 4 illustrates a method 220 for performing SPPR with single or multiple rows using the SPPR circuitry 112. As discussed above, SPPR circuitry may receive an address signal 40A and a triggering ACT signal 146. Furthermore, the SPPR circuitry 112 may receive a configuration signal 186. A latch 202 may store the address in the address signal 40A, responsive to the ACT signal 146, to provide latched address 114. An SPPR latch 204 may be used to store an address to perform an SPPR, responsive to the SPPR signal 148. By asserting the SPPR signal 148, the SPPR circuitry may enter an SPPR mode (e.g., block 222 of method 220). The addresses to be repaired may be provided via address signal 40A (e.g., block 224 of method 220). The logic element 206 (e.g., an AND gate) may combine the triggering ACT signal 146 and the asserted SPPR signal to make the SPPR latch 204 transparent. In the transparent state, SPPR latch 204 may store the address to be repaired (e.g., block 225 of method 220). Once the ACT signal 146 or SPPR signal 148 is deasserted, the SPPR latch 204 may store the repaired address. During regular operation, the SPPR latch 204 is not transparent, and may provide the SPPR address stored 208. A logic element 210 (e.g., XOR gate) may compare the stored SPPR address with the latched address 114. If the address matches (e.g., all bits of the latched address 114 are the same as the bits of the SPPR address 208), the SPPR match signal 116 may be asserted. The number of address rows to be repaired may be determined by a configuration signal 186 provided by the logic element 184 (e.g., an OR gate) that is received by the SPPR circuitry 112 (e.g., block 226 of method 220). If no configuration signal 186 is received (e.g. the configuration signal is 0), the SPPR circuitry 112 may repair a single address row (e.g., block 228 of method 220).

If a configuration signal 186 is received by the SPPR circuitry 112 in the logic high state (e.g., the configuration signal is 1), one or more Match <n:0> may be removed from the generation of SPPR match 116, thereby replacing multiple rows (2, 4, 8, etc) (e.g., block 230 of method 220). Multiple logic elements 212 A-N (e.g., NAND or NOR gates) and multiple logic elements 214 A-N (e.g., NOR gates) may combine Match <n:0> to form a single SPPR match signal 116. If the addresses match (e.g., all bits of the latched addresses 114 are the same as the bits of the SPPR addresses 208), the SPPR match signal 116 may be asserted.

Figure 5:
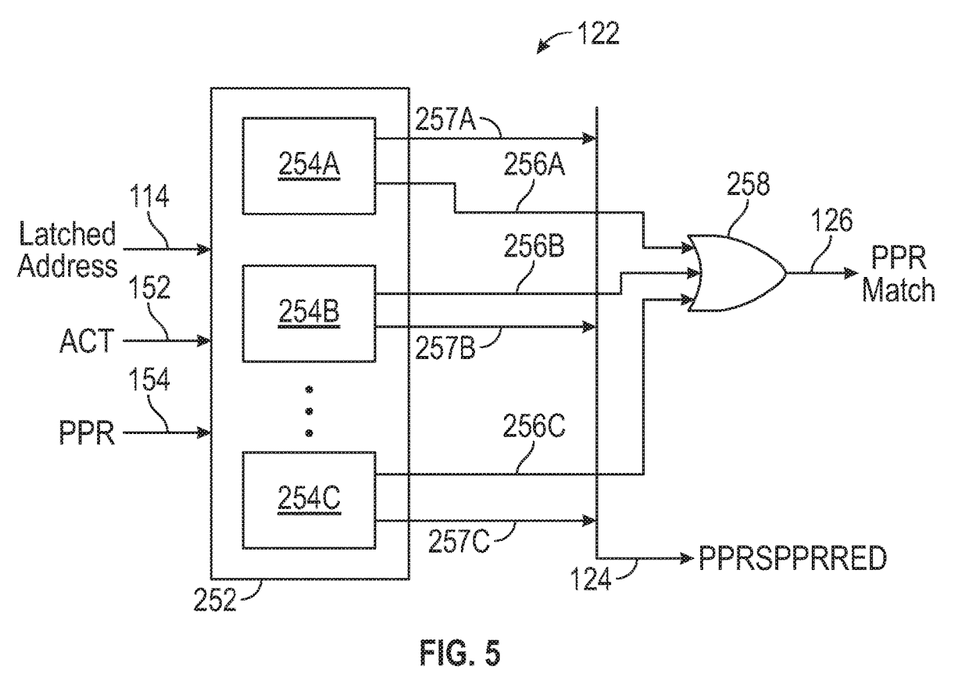
FIG. 5 is a block diagram illustrating hard PPR (HPPR) storage circuitry, that may be used by memory bank control circuitry such as that of FIG. 2, in accordance with an embodiment.
Figure 6:
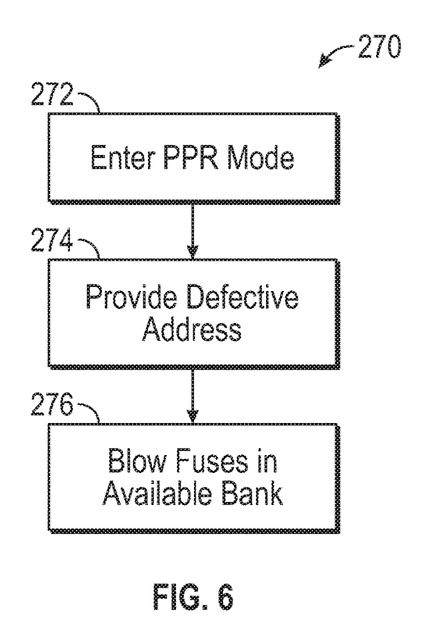
FIG. 6 is a method to perform HPPR, in accordance with an embodiment.

FIG. 5 illustrates HPPR circuitry 122, and FIG. 6 illustrates a method 270 for performing HPPR using the HPPR circuitry 122. In the illustrated HPPR circuitry 122, the non-volatile storage 252 may have antifuse banks, such as the illustrated antifuse banks 254A, 254B, and 254C. Each antifuse bank 254 may be a write-once memory device. To enter the HPPR operation (e.g., block 272 of method 270), the HPPR circuitry 122 may receive an HPPR signal 154 and a triggering ACT signal 152. The HPPR circuitry 122 may also receive the latched address 114 to be repaired (block 274 of method 270). Upon receiving the ACT signal 152, the HPPR circuitry 122 may blow fuses of the antifuse banks 254 to store the defective latched address 114 (block 276 of method 270).

During regular operation, each antifuse bank 254 may receive the latched address 114 and compare it with the stored address. For example, antifuse bank 254A may compare the latched address 114 with the address latched in antifuse bank 254A. If a match occurs, the antifuse bank 254A may assert a match signal 256A. Similarly, antifuse bank 254B may assert a match signal 256B, antifuse bank 254C may assert a match signal 256C, etc. A logic element 258 (e.g., OR gate) may combine the match signals 256A, 256B, 256C, etc., to form a single HPPR match signal 126, described above. In some embodiments, each antifuse bank may be associated with a PPR row. In such embodiment, if a match occurs, the antifuse bank 254A may provide an address 257A to the PPR row bus 124. Similarly, antifuse bank 254B may provide an address 257B and antifuse bank 254C may provide an address 257C to the PPR row bus 124. It should be noted that the addresses 257A, 257B, and 257C are addresses associated with PPR data rows 106 and may be distinct from the latched address 114 or the addresses stored in the antifuse banks 252.

Embodiments described herein may be used to allow memory devices to configurably perform soft post-package repair (SPPR) to multiple row addresses or a single row address. To that end, the embodiment may include a mode register, a control antifuse, or both to enable a logic element to send a configuration signal to activate single row repair mode or multiple row repair mode. For example, a switch may be activated on the mode register bit to alternate between single row repair mode and multiple row repair mode. The mode register bit may enable the logic element via an input signal that reaches the input terminal of the logic element. The logic element may send a configuration signal to SPPR circuitry to indicate whether to enter single row repair mode or multiple row repair mode. Furthermore, the control antifuse may be utilized to send the input signal to the logic element. In such a scenario, the control antifuse may be blown to send the input signal.

The architecture for the logic described above provides flexibility of single row or multiple row repairs in data rows using SPPR in lieu of HPPR. This modification may also allow the client to interact with SPPR with multiple row addresses prior to using HPPR. Moreover, the overriding/trumping architecture described above may be implemented in some SPPR designs with simple modifications to the control logic and addressing bus.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device comprising:
   activation circuitry comprising a mode register bit or a control antifuse configured to send a first input signal based on a first state of a switch or a second input signal based on a second state of the switch; and
   a logic element configured to:
     receive the first input signal, the second input signal, or both; and
     send, upon receiving the first input signal, a first configuration signal, wherein the first configuration signal enables a multiple row repair mode, or send, upon receiving the second input signal, a second configuration signal, wherein the second configuration signal enables a single row repair mode.

2. The memory device of claim 1, further comprising:
   soft post-packaging reassignment (SPPR) circuitry configured to:
     receive the first configuration signal, wherein the first configuration signal provides a plurality of address rows;
     enter the multiple row repair mode to repair the provided plurality of address rows; and
   compare a plurality of stored address rows to the provided plurality of address rows.

3. The memory device of claim 1, wherein the mode register bit and the control antifuse connect to the logic element via input terminals on the logic element.

4. The memory device of claim 1, wherein the mode register bit alternates between single or multiple row replacement for soft post-package repair (SPPR).

5. The memory device of claim 4, wherein the second configuration signal enables an SPPR repair for a single address and the first configuration signal enables a hard post-packaging repair (HPPR) for multiple addresses.

6. A method for soft post-package repair (SPPR) comprising:
   sending, via activation circuitry, a first input signal from a mode register bit based on a first command entry or a second input signal from the mode register bit based on a second command entry to a logic element;
   sending, via the logic element after receiving the first input signal or the second input signal, a configuration signal to SPPR circuitry; and
   enabling, via the SPPR circuitry and after receiving the configuration signal, a multiple row address repair mode in response to receiving the first input signal from the mode register bit, or a single row address repair mode in response to receiving the second input signal from the mode register bit.

7. The method of claim 6, wherein the configuration signal is a logic high signal.

8. The method of claim 6, the multiple row address repair mode compares a plurality of provided addresses to a plurality of stored addresses, and wherein the plurality of provided addresses is determined by the configuration signal.

9. The method of claim 6, wherein the mode register bit sends the first input signal after receiving the first command entry.

10. The method of claim 6, wherein an antifuse is blown to send the first input signal or the second input signal.

11. The method of claim 6, wherein the mode register bit sends the second input signal after receiving the second command entry.

12. The method of claim 6, wherein the configuration signal is a logic low signal.

13. A memory device, comprising:
a memory bank comprising a plurality of addressable groups of memory cells, wherein the plurality of addressable groups of memory cells comprises a primary set of addressable groups and a secondary set of addressable groups; and
control circuitry configured to activate an addressable group of the plurality of addressable groups, the control circuitry comprising:
first repair circuitry comprising a first non-volatile memory configured to store a first set of addresses corresponding to a first defective addressable group of the plurality of addressable groups repaired in a first mode;
second repair circuitry comprising a second non-volatile memory configured to store a second set of addresses corresponding to a second defective addressable group of the plurality of addressable groups repaired in a second mode;
activation circuitry comprising a mode register bit or a control antifuse configured to send an input signal upon activation, wherein the mode register bit is configured to alternate between a multiple row repair mode or a single row repair mode via a command entry; and
a logic element configured to:
receive the input signal; and
send, upon receiving the input signal, a configuration signal, wherein the configuration signal enables the multiple row repair mode, or the single row repair mode of the first defective addressable group or the second defective addressable group.

14. The memory device of claim 13, wherein the mode register bit and the control antifuse connect to the logic element via input terminals on the logic element.

15. The memory device of claim 13, wherein the mode register bit alternates between single row testing and multiple row testing via a switch.

16. The memory device of claim 13, wherein the mode register bit alternates between single row testing and multiple row testing via the command entry.

17. The memory device of claim 13, further comprising:
soft post-packaging reassignment (SPPR) circuitry configured to:
receive the configuration signal, wherein the configuration signal provides a plurality of address rows;
enter the multiple row repair mode to repair the provided plurality of address rows; and
compare the first defective group or the second defective group to the provided plurality of address rows.

18. The memory device of claim 17, wherein the SPPR circuitry comprises a plurality of logic elements, and wherein each logic element of the plurality of logic elements compares a provided address row from the plurality of address rows to a defective address row of the first defective group or the second defective group.

19. The memory device of claim 17, wherein the configuration signal enables the SPPR circuitry to repair the plurality of address rows as a hard post-package repair.

20. The memory device of claim 13, wherein the control circuitry comprises third repair circuitry comprising a volatile memory configured to store an address corresponding to a third defective addressable group repaired in a soft post-packaging repair, and wherein the logic element is configured to compare a received address with the address stored in the volatile memory.

* * * * *